United States Patent
Prasad

(10) Patent No.: US 7,290,230 B2
(45) Date of Patent: Oct. 30, 2007

(54) SYSTEM AND METHOD FOR VERIFYING A DIGITAL DESIGN USING DYNAMIC ABSTRACTION

(75) Inventor: Mukul R. Prasad, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 112 days.

(21) Appl. No.: 11/082,592

(22) Filed: Mar. 17, 2005

(65) Prior Publication Data

US 2006/0212837 A1   Sep. 21, 2006

(51) Int. Cl.
*G06F 17/50* (2006.01)
*G06F 9/45* (2006.01)

(52) U.S. Cl. .................... 716/5; 716/2; 716/3; 716/4
(58) Field of Classification Search ............... 716/2–5
See application file for complete search history.

(56) References Cited

U.S. PATENT DOCUMENTS

| | | | |
|---|---|---|---|
| 5,953,519 A * | 9/1999 | Fura ............................. | 716/18 |
| 6,643,827 B1 * | 11/2003 | Yang ............................. | 716/2 |
| 6,728,939 B2 * | 4/2004 | Johannsen ..................... | 716/5 |
| 6,957,404 B2 * | 10/2005 | Geist et al. ..................... | 716/4 |
| 2004/0153308 A1 * | 8/2004 | McMillan et al. .............. | 704/5 |
| 2005/0086648 A1 * | 4/2005 | Andrews et al. ............ | 717/135 |
| 2005/0114809 A1 * | 5/2005 | Lu ................................. | 716/5 |
| 2005/0210433 A1 * | 9/2005 | Clarke et al. .................. | 716/5 |
| 2006/0190864 A1 * | 8/2006 | Ganai et al. ................... | 716/5 |

OTHER PUBLICATIONS

Gupta, A., et al. "Iterative Abstraction using SAT—Based BMC with Proof Analysis", ICCAD '03, Nov. 11-13, pp. 416-423.*

* cited by examiner

*Primary Examiner*—Vuthe Siek
*Assistant Examiner*—Magid Y. Dimyan
(74) *Attorney, Agent, or Firm*—Baker Botts LLP

(57) ABSTRACT

A method for verifying a digital system design is provided. A first abstraction of a digital system design is performed to obtain an abstract model of the digital system design. One or more first steps of a multiple-step model checking process are performed using the abstract model, the multiple-step model checking process being operable to verify the digital system design. During the multiple-step model checking process, a second abstraction is performed to refine the abstract model. One or more second steps of the multiple-step model checking process are then performed using the refined abstract model.

8 Claims, 4 Drawing Sheets

| PROBLEM | STATIC | | DYNAMIC I | | DYNAMIC II | |
|---|---|---|---|---|---|---|
| | PEAK | FINAL | PEAK | FINAL | PEAK | FINAL |
| P2 | 253K | 57K | 77K | 18K | 158K | 49K |
| P4 | 61K | 650 | 81K | 13K | 54K | 763 |
| P8 | 331K | 22K | 183K | 13K | 252K | 14K |
| P11 | 132K | 10K | 117K | 8160 | 130K | 11K |
| P12 | 4360K | 628K | 852K | 120K | 4360K | 628K |

| PROBLEM | PASS/FAIL | CONCRETE MODEL | | | STATIC ABSTRACTION | | DYNAMIC HEURISTIC I | | DYNAMIC HEURISTIC II | |
|---|---|---|---|---|---|---|---|---|---|---|
| | | # PIs | # FFs | # GATES | # FFs | TIME(S) | # FFs (DIFF.) | TIME(S) | # FFs (DIFF.) | TIME(S) |
| P1 | PASS | 330 | 1158 | 5155 | 264 | 133 | 204 (-60) | 97 | 221 (-43) | 114 |
| P2 | PASS | 401 | 1896 | 8910 | 257 | 936 | 218 (-39) | 171 | 240 (-17) | 550 |
| P3 | PASS | 405 | 1951 | 8577 | 266 | 187 | 243 (-23) | 311 | 252 (-14) | 172 |
| P4 | PASS | 671 | 2735 | 11381 | 271 | 68 | 211 (-60) | 145 | 249 (-22) | 68 |
| P5 | PASS | 1015 | 2971 | 10044 | 286 | 474 | 216 (-70) | 258 | 276 (-10) | 441 |
| P6 | PASS | 1020 | 3039 | 10060 | 277 | 360 | 224 (-53) | 90 | 254 (-23) | 141 |
| P7 | PASS | 1981 | 5407 | 18193 | 245 | 322 | 222 (-23) | 390 | 227 (-18) | 219 |
| P8 | PASS | 1950 | 5468 | 19161 | 224 | 1198 | 184 (-40) | 305 | 201 (-23) | 769 |
| P9 | PASS | 1943 | 5644 | 19189 | 268 | 89 | 234 (-34) | 77 | 247 (-21) | 79 |
| P10 | PASS | 3490 | 8998 | 27297 | 293 | 563 | 221 (-72) | 85 | 269 (-24) | 270 |
| P11 | 60 | 308 | 746 | 3837 | 123 | 687 | 81 (-42) | 658 | 87 (-36) | 690 |
| P12 | 36 | 289 | 654 | 4823 | 170 | 30704 | 160 (-10) | 1880 | 170 (0) | 30632 |
| P13 | 29 | 289 | 654 | 4826 | 201 | >24H (27) | 168 (-33) | 23781 | 196 (-5) | >24H (27) |
| P14 | ? | 356 | 1644 | 7408 | 115 | >24H (13) | 93 (-22) | >24H (26) | 109 (-6) | >24H (13) |

*FIG. 4*

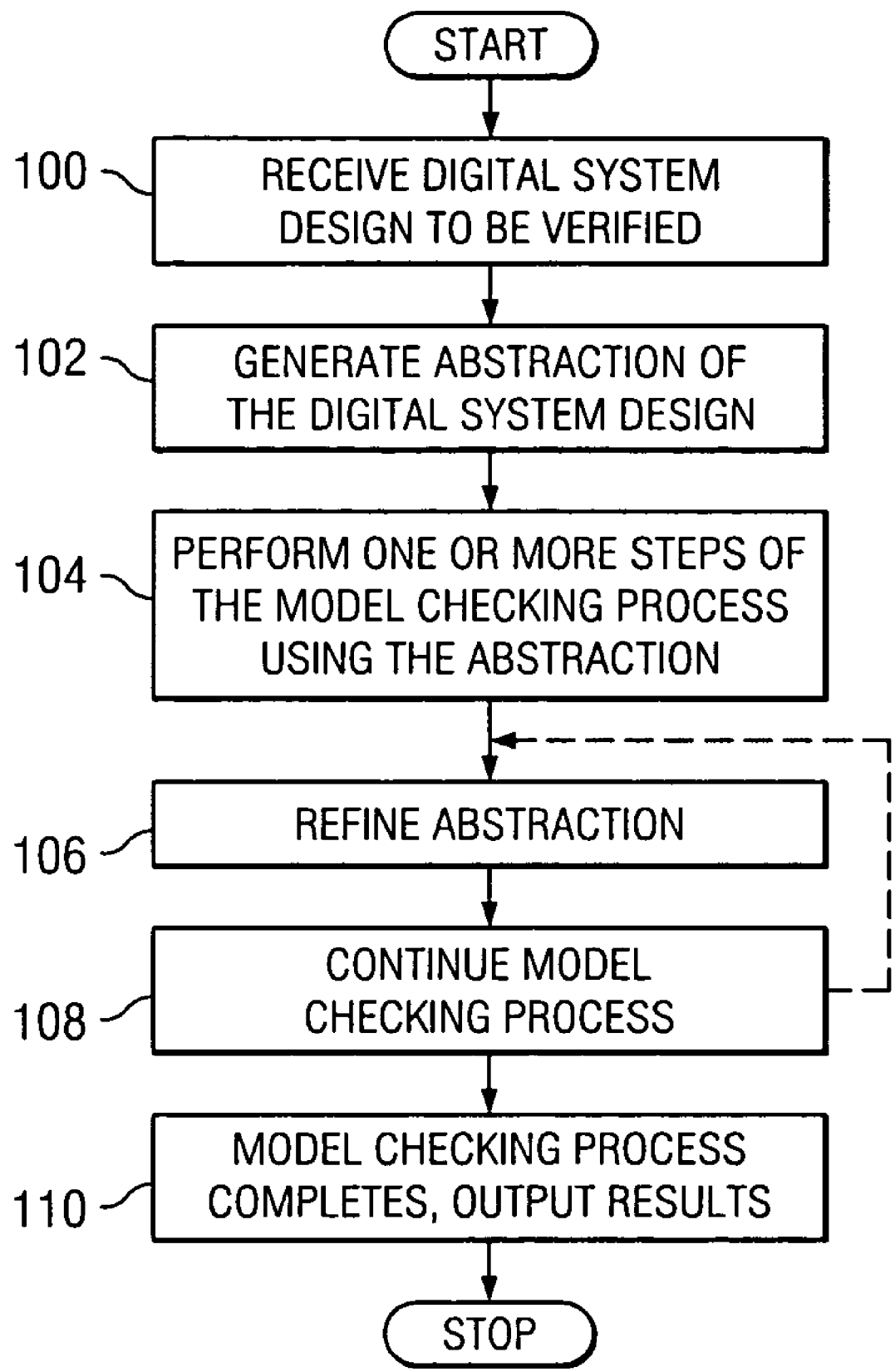

SYSTEM AND METHOD FOR VERIFYING A DIGITAL DESIGN USING DYNAMIC ABSTRACTION

TECHNICAL FIELD OF THE INVENTION

This invention relates in general to verification of digital designs and, more particularly, to systems and methods for verifying a digital design using dynamic abstraction.

BACKGROUND OF THE INVENTION

The application of formal verification techniques, such as model checking, to real-life industrial designs, has traditionally been hampered by what is commonly known as the state explosion problem. Dramatic increases in the size of digital systems and components and the corresponding exponential increase in the size of their state space have kept industrial-size designs well beyond the capacity of current model checkers. "Abstraction refinement" has recently emerged as a promising technology that has the potential to bridge this verification gap.

The basic idea behind abstraction refinement is to attempt to verify the property at hand on a simplified version of the given design. This simplified version, or "abstraction," is generated by removing elements from the original design that are not relevant to the proof of the given property. If the property passes on the abstract model it is guaranteed to be true on the original design as well. However, if the property fails, counter-examples produced on the abstract model must be validated against the original design. If this is not possible, the process is iterated with another abstract model which approximates the original model more closely. The new abstract model can be obtained by embellishing the current abstraction with more details from the original design or by re-generating a more complete abstract model from the original design. Usually the challenge in abstraction refinement is to construct as small an abstract model as possible, to facilitate the model checking, while retaining sufficient detail in the abstraction to decide the property. Thus, the ideal technique for abstraction refinement is one which achieves a good balance between the size and accuracy of the abstract model.

Abstraction refinement methods can be broadly classified into two kinds of methods, namely (1) counter-example driven and (2) counter-example independent. Counter-example driven methods for abstraction refinement typically work by iteratively refining the current abstraction so as to block a particular (false) counter-example encountered in model checking the previous abstract model. The refinement algorithm could use a combination of structural heuristics or functional analysis based on SAT or BDDs or some combination of these. Some recent techniques have enlarged the scope of the refinement by using multiple counter-examples from the previous abstract model.

The basic idea of counter-example independent abstraction refinement is to perform a SAT-based bounded model check (BMC) of the property up to some depth, k, on the original design and generate the abstract model through an analysis of the proof of unsatisfiability of the BMC problem. Essentially, the abstraction excludes latches and/or gates that are not included in the proof of unsatisfiability of the BMC problem and thereby guarantees that the abstract model also does not have any counter-examples up to depth k. Successive abstract models are similarly generated by solving BMC problems of increasing depth.

SUMMARY OF THE INVENTION

In accordance with the present invention, system and methods are provided for verifying a digital design using dynamic abstraction.

According to one embodiment, a method for verifying a digital system design is provided. A first abstraction of a digital system design is performed to obtain an abstract model of the digital system design. One or more first steps of a multiple-step model checking process are performed using the abstract model, the multiple-step model checking process being operable to verify the digital system design. During the multiple-step model checking process, a second abstraction is performed to refine the abstract model. One or more second steps of the multiple-step model checking process are then performed using the refined abstract model.

According to another embodiment, logic for verifying a digital system design is provided. The logic is encoded in one or more media for execution using one or more processors and, when executed, is operable to perform a first abstraction to obtain an abstract model of a digital system design. The logic is further operable to perform one or more first steps of a multiple-step model checking process using the abstract model, the multiple-step model checking process operable to verify the digital system design. The logic is further operable to perform, during the multiple-step model checking process, a second abstraction to refine the abstract model, and to perform one or more second steps of the multiple-step model checking process using the refined abstract model.

According to yet another embodiment, a system for verifying a digital system design is provided. The system includes an integrated abstraction and verification module. The integrated abstraction and verification module is operable to perform a first abstraction to obtain an abstract model of a digital system design, and to perform one or more first steps of a multiple-step model checking process using the abstract model, the multiple-step model checking process being operable to verify the digital system design. The integrated abstraction and verification module is operable to perform, during the multiple-step model checking process, a second abstraction to refine the abstract model, and to perform one or more second steps of the multiple-step model checking process using the refined abstract model.

According to still another embodiment, another method for verifying a digital system design is provided. A model checking process including a plurality of steps is performed to verify a digital system design. The model checking process uses an abstract model of the digital system design that includes a plurality of logical state elements. After a portion of the plurality of steps, the abstract model is refined, and the model checking process is continued using the refined abstract model.

According to still another embodiment, another system for verifying a digital system design is provided. The system includes means for performing a first abstraction to obtain an abstract model of a digital system design, and means for performing one or more first steps of a multiple-step model checking process using the abstract model, the multiple-step model checking process being operable to verify the digital system design. The system also includes means for performing, during the multiple-step model checking process, a second abstraction to refine the abstract model, and means for performing one or more second steps of the multiple-step model checking process using the refined abstract model.

Various embodiments of the present invention may benefit from numerous advantages. It should be noted that one or more embodiments may benefit from some, none, or all of the advantages discussed below.

Previous techniques for abstraction refinement work on static abstractions, in that the abstract model produced by the abstraction algorithm is not modified by the downstream model checking. In general, the present invention includes dynamic methods of abstraction, which can be applied during successive steps of the model checking algorithm to further abstract the model produced by traditional static abstraction methods. This is facilitated by information gathered from an analysis of the proof of unsatisfiability of SAT-based bounded model checking problems, solved on the concrete model, and passed to the model checker. It effectively allows the model checker to work with smaller abstract models. Such dynamic abstraction significantly improves the performance of the abstraction refinement flow and also enables the successful application of abstraction refinement-based model checking to larger designs.

More particularly, when a property is checked on a circuit model using, for instance, a typical BDD-based symbolic model checker, there may be state elements that are "partially abstractable," i.e., while the state element is necessary in the proof of the property, it may actually be required only in certain image computation steps. For example, there may be latches in a circuit design that are solely present for initialization purposes, i.e., for the purpose of proving the given property they effectively become redundant after a few steps of image computation.

The present invention includes systems and methods of dynamic abstraction whereby the design under verification is abstracted during successive image computation steps of the model checking phase. This abstraction can be performed in addition to and after the abstraction through a traditional static abstraction algorithm. This provides for a more aggressive yet accurate abstraction methodology, effectively allowing the core model checking algorithm to work on smaller abstract models. In some embodiments, information regarding the dynamic abstractability of different latches is deduced from an analysis of the unsatisfiable core of SAT-based bounded model checking problems, solved on the concrete model, and passed to the model checker. An important benefit of such dynamic abstraction is that because it is tightly coupled to the model checker, feedback from the model checking process can be effectively used to guide the model checking process.

As discussed above, traditional abstraction refinement techniques share two common features, namely (1) the abstraction step is algorithmically distinct from the model checking, i.e., the abstraction is performed outside the model checker, and (2) the abstraction is purely structural in nature and has no temporal component, i.e., the same structural abstraction is used for each image computation step in BDD-based model checking (or each unrolled time-frame in SAT-based BMC). The abstraction refinement techniques of the present invention can be distinguished from such traditional abstraction refinement techniques based on these two aspects. The abstraction refinement techniques of the present invention analyze the temporal behavior of various state elements (e.g. latches) and based on this analysis, dynamically abstracts sets of state elements (e.g. latches) during the course of the model checking. Thus, the abstraction and the model checking verification functions are integrated. For example, in the case of a BDD-based model checker, successively more abstracted versions of the transition relation are used for successive image computation steps. The dynamic abstraction techniques of the present invention can be applied in addition to any abstraction performed by any traditional static abstraction methods. For example, the dynamic abstraction techniques of the present invention may be applied to both counter-example dependant and counter-example independent abstraction refinement frameworks.

Other advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 4 illustrates Table 1 indicating example experimental results from implementing a traditional static abstraction and a pair of dynamic abstraction heuristics to test an example digital system design; FIG. 6 illustrates a method of verifying a digital system design in accordance with an embodiment of the invention.

DETAILED DESCRIPTION OF THE DRAWINGS

Example embodiments of the present invention and their advantages are best understood by referring now to FIGS. 1 through 6 of the drawings, in which like numerals refer to like parts.

In general, systems and methods for verifying a digital design using dynamic abstraction in model checking processes are provided. Unlike traditional abstraction refinement techniques, which consist of static abstractions, the systems and methods provided herein include dynamic abstraction techniques, which can be applied during successive steps of a model checking algorithm to further abstract the model produced by traditional static abstraction techniques. In some embodiments, this dynamic abstraction is facilitated by information gathered from an analysis of the proof of unsatisfiability of SAT-based bounded model checking problems, solved on the concrete model, and passed to the model checker. The dynamic abstraction effectively allows the model checker to work with smaller abstract models, and significantly improves the performance of the abstraction refinement flow, and also enables the successful application of abstraction refinement-based model checking to larger designs.

Figure 1:
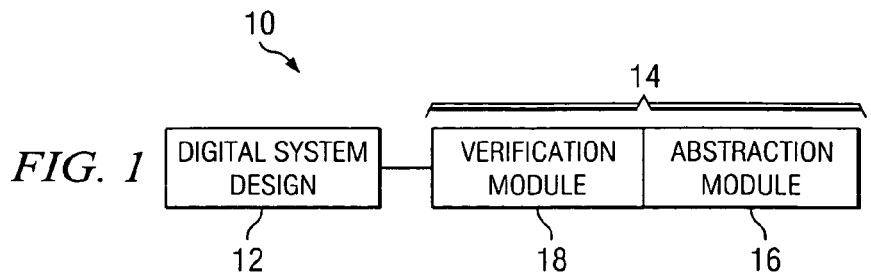
FIG. 1 illustrates a system for verifying a digital system design using dynamic abstraction techniques in accordance with one embodiment of the invention.

FIG. 1 illustrates a system 10 for verifying a digital system design using dynamic abstraction techniques in accordance with one embodiment of the invention. System 10 includes a digital system design 12 coupled to an integrated abstraction and verification tool 14. Digital system design 12 may comprise any portion or all of a digital hardware design, software application or code, or any other digital system or design, model, simulation, or other representation of a digital system. For example, digital system design 12 may be a software application, such as an email application, a game application, or an operating system, for example. As another example, digital system design 12 may be a computer-based model of a digital circuit for which verification of the circuit design is desired. Digital system design 12 may include any number and types of digital components, including any number and types of logical state elements, such as latches and gates, for example.

Integrated abstraction and verification tool 14 includes an abstraction module 16 integrated with a verification module 18. Abstraction module 16 is generally operable to perform abstractions of digital design 12 and abstraction refinement (i.e., abstractions of abstractions) functions. Verification module 18, which may also be referred to as model checking module 18, is generally operable to perform a verification of digital design 12 using abstractions generated by abstraction module 16. In some embodiments, verification module 18 may provide BDD-based model checking functionality. As described in greater detail below, the abstraction refinement techniques provided by integrated abstraction and verification tool 14 analyze the temporal behavior of various state elements (e.g. latches) and based on this analysis, dynamically abstracts sets of state elements (e.g. latches) during the course of the model checking. Thus, unlike traditional abstraction refinement techniques, integrated abstraction and verification tool 14 provides abstraction refinement techniques in which (1) the abstraction steps are algorithmically integrated with the model checking, and (2) the abstraction has a temporal component such that different structural abstractions are used for different steps in the model checking process. As used herein, a "step" of a model checking process may refer to any component of the model checking process, such as an image computation step in BDD-based model checking, or an unrolled time-frame in SAT-based BMC, for example.

Integrated abstraction and verification tool 14, including abstraction module 16 and verification module 18, may include any hardware, software, or embedded logic that can be utilized by a user to perform any of the functionality discussed herein with respect to the present invention. For example, Integrated abstraction and verification tool 14 may include one or more computer systems, or logic or software encoded in media which may be executed by one or more computer systems to perform the functionality discussed herein. The term "computer" refers to any suitable device operable to accept input, process the input according to predefined rules, and produce output, for example, a personal computer, workstation, network computer, one or more processors within these or other devices, or any other suitable processing device.

Particular embodiments of the functionality performed by integrated abstraction and verification tool 14 are discussed below.

Abstraction Introduction

The following discussion focuses on model checking of invariants, i.e., CTL properties of the form AGp where p is a Boolean expression on the variables of the given circuit model. The circuit under verification can be modeled as a sequential circuit M with primary inputs $W=\{w_1, w_2, \ldots, w_n\}$, present state variables $X=\{x_1, x_2, \ldots, x_m\}$ and the corresponding next state variables $Y=\{y_1, y_2, \ldots y_m\}$. Thus, M can be represented as $M=<T(X,Y,W),I(X)>$, where $T(X, Y, W)$ is the transition relation and $I(X)$ is the set of initial states (more precisely the characteristic function of the set of initial states). M has a set of latches (state elements) $L=\{l_1, l_2, \ldots, l_m\}$. Thus, $x_i$ and $y_i$ would be the present state and next state variables corresponding to latch $l_i$. The transition relation T is a conjunction of the transition relations of the individual latches. Thus, $$T(X, Y, W) = \bigwedge_{i \in \{1 \ldots m\}} T_i(X, y_i, W)$$

Here, $T_i(X,y_i,W)=y_i \Leftrightarrow \Delta_i(X,W)$ is the transition relation of latch $l_i$ and $\Delta_i(X, W)$ is its transition function in terms of primary inputs and present state variables.

Given a subset of latches $L_{abs}=\{l_1, l_2, \ldots, l_q\}$, $L_{abs} \subseteq L$, that a user would like to abstract away from the design, the abstracted model can be constructed by cutting open the feedback loop of latches $L_{abs}$ at their present-state variables $X_{abs}$, i.e. making the variables $X_{abs}$ primary inputs and removing the logic cones of the transition functions of latches $L_{abs}$ from the circuit model. Functionally, the abstracted transition relation $\hat{T}$ can be defined as:

$$\hat{T}(\hat{X}, \hat{Y}, \hat{W}) = \bigwedge_{i: l_i \in \hat{L}} \hat{T}_i(\hat{X}, y_i, \hat{W}) \quad (1)$$

where $\hat{W}=W \cup X_{abs}$, $\hat{X}=X-X_{abs}$, $\hat{Y}=\{y_i:x_i \notin \hat{X}\}$, and for all i such that $y_i \in \hat{Y}, \hat{T}(\hat{X},y_i,\hat{W})=T(X,y_i,W)$.

A concept that will be frequently used in the following treatment is that of the proof of unsatisfiability (POU) of a CNF SAT formula. As known in the art, certain modern SAT solvers can be modified to produce a proof of unsatisfiability when the CNF formula being solved is found to be unsatisfiable. The proof of unsatisfiability (denoted by P in the sequel) of a SAT CNF formula can be represented as a directed acyclic graph, the nodes of which are clauses and each node (other than the leaves) has precisely two children. The root of this graph is the empty clause and the leaves are clauses from the original CNF. All other nodes (including the root) such that they can be derived through a resolution operation on their two children clauses.

A simplified version of the algorithm for abstraction refinement in some embodiments is shown as Algorithm 1.

---

Algorithm 1: Abstraction Refinement Using SAT-BMC

```
 1: k = InitValue
 2: if SAT-BMC (M, p, k) is SAT then
 3:     return "found error trace"
 4: else
 5:     Extract proof of unsatisfiability, P of SAT-BMC
 6:     M' = ABSTRACT (M,P)
 7: end if
 8: if MODEL_CHECK (M',p) returns PASS then
 9:     return "passing property"
10: else
11:     Increase bound k
12:     goto Step 2
13: end if
```

---

The abstraction is based on the use of SAT-based bounded model checking (BMC). Let v be a variable in the representation of the transition relation T. A k-step BMC problem is generated by unrolling and replicating T, k times. Let $v^1$, $v^2, \ldots, v^k$ denote the k instantiations of v in the unrolled BMC problem. The idea of the abstraction method is to solve k-step SAT-BMC problem on the original design and analyze the POU returned by the SAT solver to generate the abstraction. The POU is scanned to identify a set of latches $L_{abs}$ such that for each $l \epsilon L_{abs}$ the variables $l^1, l^2, \ldots, l^k$ do not appear in any of the clauses of the POU. These latches can then be abstracted using Equation (1) (in the ABSTRACT operation in Step 6 of Algorithm 1). The rationale is that since these latches probably do not contribute to the property check in the first k time-frames, they might be irrelevant from the point of view of deciding this property for unbounded behaviors as well.

The model checking algorithm employed in Algorithm 1 (Step 8) may use a variety of methods. For simplicity of exposition we will assume a symbolic model checker using BDDs. However, our ideas can be applied to other methods, such as SAT-based induction or BMC, for example, in a fairly straightforward manner. Algorithm 2 shows the pseudo-code for a symbolic invariant checking algorithm that could use BDDs. Here, B denotes the "bad states," i.e., states that violate p, and $S_C$ denotes the set of currently reached states. Basically, the algorithm computes the set of states reachable from the initial states checking intersection of $S_C$ with B after each step. The core operation is the image operation Img, defined in Equation (2) below. It computes the states reachable in one step, via the transition relation T, from the current states $S_C$.

$$\text{Img}(Y) = \exists X, W. S_c(X) \cdot T(X, Y, W) \quad (2)$$

---

Algorithm 2: Symbolic Invariant Checking

```
Invariant Check (M<T,I>,B)
1:    S_C = 0; S_N = I ;
2:    while S_C ≠ S_N do
3:       S_C = S_N;
4:       if B ∩ S_C ≠ 0 then
5:          return "found error trace";
6:       end if
7:       S_N = S_C ∪ Img(S_C);
8:    end while
9:    return "no bad state reachable";
```

---

Dynamic Abstraction

The dynamic abstraction technique of particular embodiment of the present invention is based on an analysis of the proof of unsatisfiability of a SAT-BMC problem solved on the concrete design.

Figure 2:
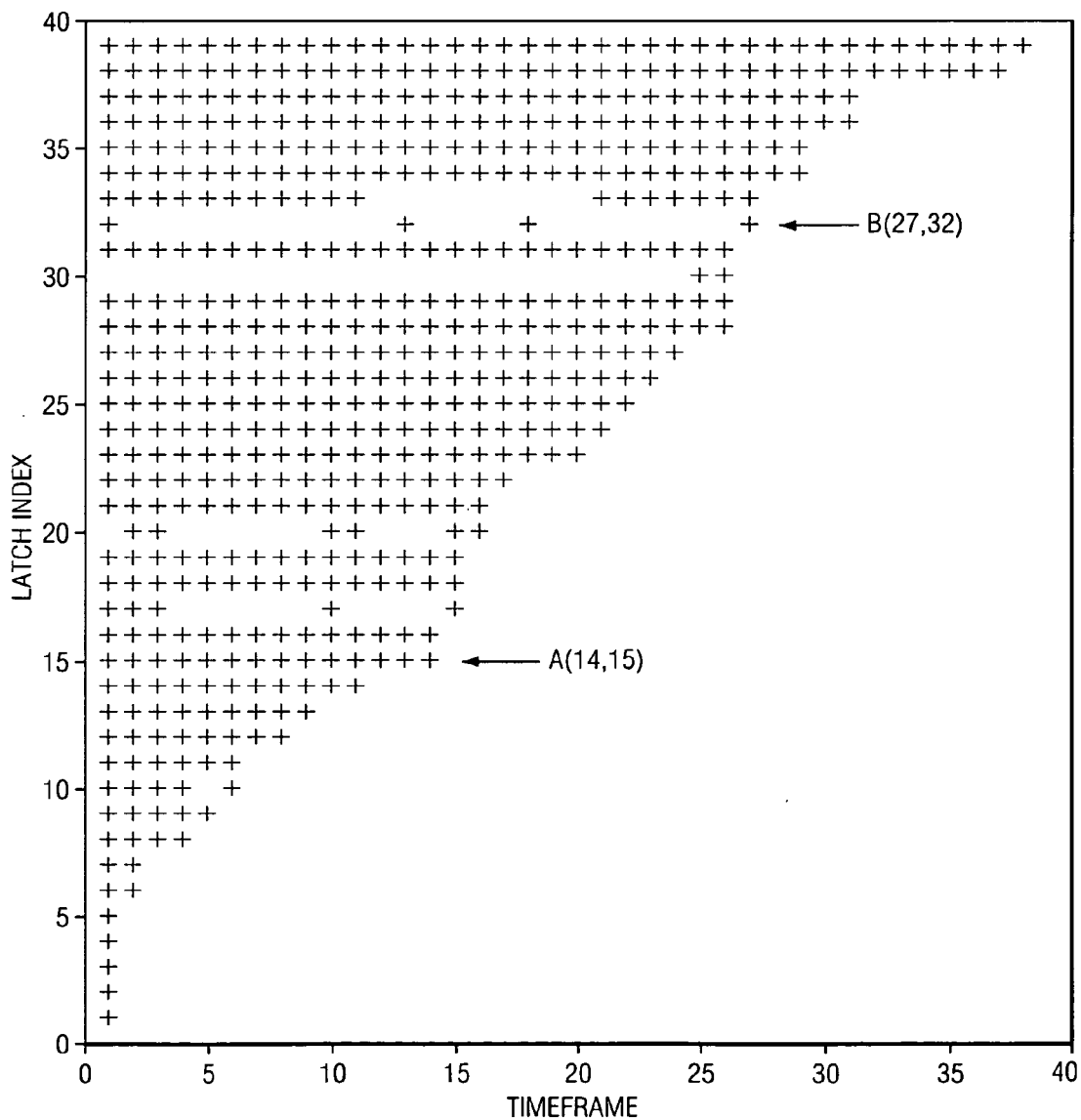
FIG. 2 is a graphical representation of the proof of unsatisfiability (POU) from a 40-step SAT-BMC problem on an example circuit.

Given the original circuit M and the property P=AGp, suppose that a SAT-BMC problem of depth k has been solved on M and found no counter-example. Further, suppose that the SAT solver generates a proof of unsatisfiability P for this problem. FIG. 2 is a graphical representation of the POU from a 40-step SAT-BMC problem on a real circuit example. For each latch (plotted for 40 representative latches on the y-axis) the plot shows the time-frames for which the corresponding instantiation of the latch variable appeared in the POU of the SAT-BMC problem. The latches have been sorted on the y-axis for better readability of the data. Given a latch variable $l \epsilon L$, we can define the "redundancy index," $\rho(l)$ of l, with respect to the proof P, as follows:

DEFINITION 1 (REDUNDANCY INDEX). The redundancy index $\rho(l)$ of latch l with respect to the proof of unsatisfiability P is the smallest time-frame index such that for all time-frames j, $\rho(l) \leq j \leq k$, there does not exist a clause with variable $l^j$ in P.

For example, in FIG. 2, the points marked A and B show that latch number 15 has a redundancy index of 15 and latch 32 has a redundancy index of 28. Simply put, the redundancy index is the earliest time-frame after which the given latch stops participating in the POU of the current BMC problem. The situation depicted in FIG. 2 is typical of a large variety of benchmarks that have been experimented with. Most latches are not used in all time-frames of the POU. Moreover, there are several latches that are only used in the first few time-frames.

In the following discussion, a result is developed which shows that latch l can be dynamically abstracted from the transition relation anytime after $\rho(l)$ image computation steps in the invariant checking algorithm of Algorithm 2, and still have the model checking result match that of the BMC up to the first k steps.

At each step of image computation a "candidate set" of latches can be defined, which is essentially the set of latches whose redundancy index is less than or equal to the index of the current image computation step.

DEFINITION 2 (CANDIDATE SET). The candidate set of latches for iteration j of image computation in Algorithm 3.2 is denoted $C_j$ and is defined as $C_j = \{l_i ; l_i \epsilon L, \rho(l_i) \leq j\}$ For example, in FIG. 2, the candidate set at time-frame 15 consists of the first 15 latches, i.e., $C_{15} = \{l_1, l_2, \ldots, l_{15}\}$. A modified version of Algorithm 2, incorporating dynamic abstraction, is provided below as Algorithm 3.

---

Algorithm 3: Symbolic Invariant Checking
with Dynamic Abstraction

```
Invariant Check.Dynamic Abstract (M<T,I>B)
1:    S_C = 0; S_N = I ;
2:    while S_C ≠ S_N do
3:       L_abs = CHOOSE_ABSTRACTION_LATCHES(L);
4:       T = ABSTRACT_TR(L_abs, T);
5:       B = ∃X_abs.B ;
6:       S_C = S_N;
7:       S_C = ∃X_abs.S_C;
8:       if B ∩ S_C ≠ 0 then
9:          return "found error trace";
10:      end if
11:      S_N = S_C ∪ Img(S_C);
12:   end while
13:   return "no bad state reachable";
```

---

In Algorithm 3, $X_{abs}$ are the present state variables corresponding to the latches $L_{abs}$ chosen for abstraction, ABSTRACT_TR abstracts the chosen latches from the transition relation, as per Equation (1) and the operation CHOOSE_ABSTRACTION_LATCHES is a heuristic to choose a subset of the candidate latches of the current iteration (Definition 2), for abstraction.

Because the dynamic abstraction is developed from an analysis of the POU of a k-step SAT-BMC problem, the following result can be stated about the correctness of Algorithm 1:

THEOREM 1. Algorithm 1 will not find a counter-example to the given property in the first k steps of image computation.

The proof of this result is based on the observation that the above dynamic abstraction implementation is equivalently implemented as SAT-BMC by unrolling T for k time-frames and cutting open the unrolled latches in the requisite time-frames that were abstracted by the dynamic abstraction algorithm during the image computation. The original POU P still applies to this abstracted BMC problem since the abstracted variables did not appear in it to begin with.

Latch Selection Heuristic

A key component of Algorithm 1 is the latch selection heuristic CHOOSE_ABSTRACTION_LATCHES. This decides which latches, out of the current candidate set, should be abstracted at a given image computation step. In some embodiments, this heuristic can have a significant bearing on the overall performance of the algorithm.

The most aggressive approach would be to perform dynamic abstraction for all latches in the current candidate set and at the earliest possible time as indicated by the redundancy index (RI) of each latch. However, this approach may have several drawbacks. The following issues drive the choice of this heuristic Issue (1): How often to abstract latches: In the aggressive version of the heuristic described above, abstraction may need to be performed very frequently, in the most extreme case at every image computation step. Since the dynamic abstraction is implemented via quantification of next-state variables, from the transition relation (TR), the overhead can be significant. Thus, in embodiments in which the reduction of overhead (e.g. computational resources) is desired, a heuristic that limits the abstraction to a few image computation steps may be used.

Issue (2): Extrapolating unbounded behavior from $\rho(l)$: In abstraction based on POU of a k-step SAT-BMC we are trying to extrapolate unbounded behavior of a latch, with respect to the given property, based on its bounded behavior. Intuitively, a latch that was active only in the first few steps of the BMC (i.e. one that has a small RI), such as latch $l_2$ in FIG. 2, for example, is more likely to be inactive beyond k time-steps than one which was active up to k-1 or k-2 steps (i.e. one that has a large RI), such as latch $l_{38}$ in FIG. 2, for example. This intuition is supported by the data shown in FIG. 3.

Figures 3, 5:
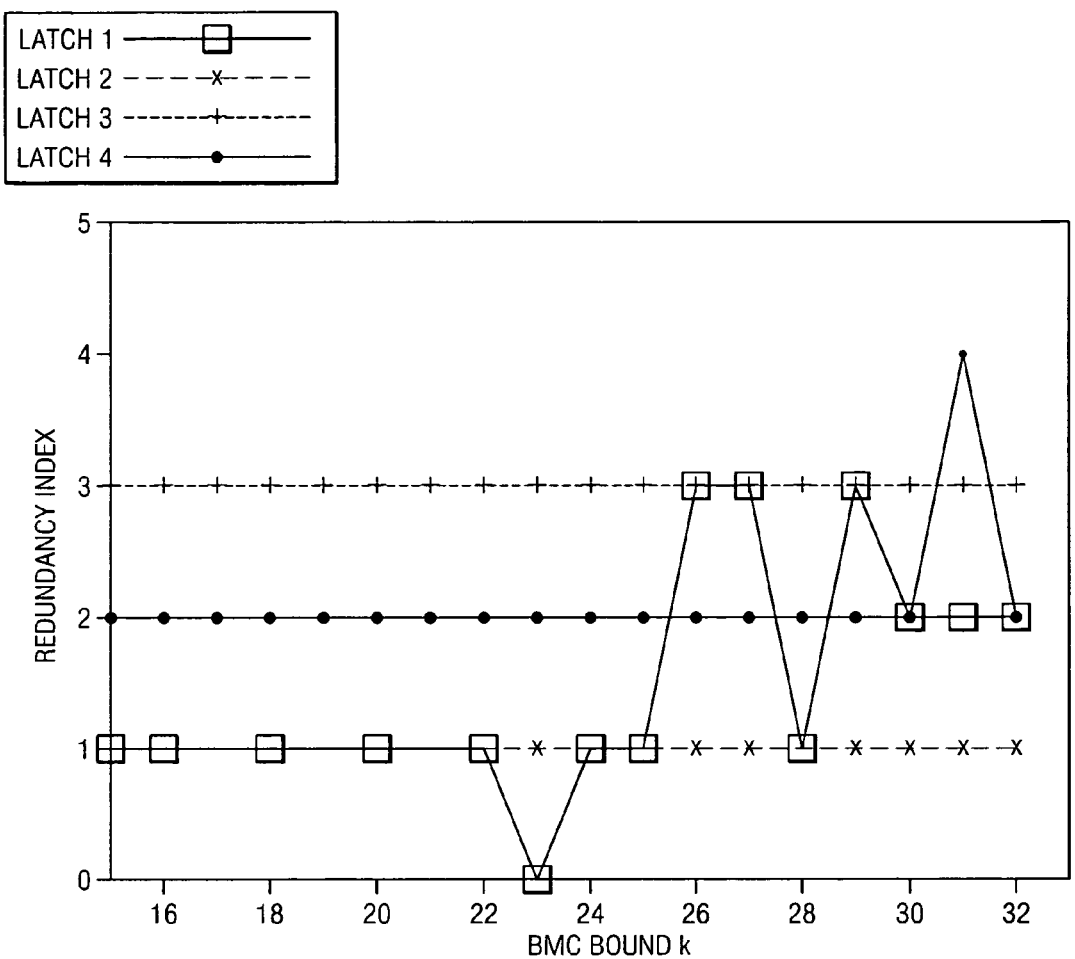
FIG. 3 is a graph illustrating the redundancy indices (RIs) for four latches from an example digital system design, generated from the POUs of different BMC problems with varying depth k.
FIG. 5 illustrates Table 2 indicating more detailed statistics of the BDD-model checking process for some representative benchmarks from Table 1 of FIG. 4.

FIG. 3 is a graph illustrating the redundancy indices for four latches from an example design, generated from the POUs of different BMC problems with varying depth k. Apart from minor fluctuations, the RI values of each latch are remarkably consistent, despite having been derived from independent BMC runs of different depth. Of course this is not the case for every latch, an artifact of the intrinsic approximate nature of any abstraction refinement framework. However, such consistency in the RI values is observed for a large percentage of the latches actually abstracted by the algorithms of the presented invention.

Issue (3): Size and depth of the reachable state space: Abstraction of latches comes at the cost of enlarging the set of permissible behaviors of the circuit. This can potentially enlarge the reachable state space, result in larger BDDs for the reached state representation, and/or increase the depth of the reachability computation. This factor should be considered by the latch selection heuristic if possible.

With the above criteria in mind, several heuristics have developed and tested for CHOOSE_ABSTRACTION_LATCHES. Two heuristics were found to give a particularly desirable tradeoff between overheads and abstraction power. Other variants of these two heuristics may be used in other embodiments, such as embodiments in which different factors are important.

Heuristic 1: Dynamically abstract just once at [δ·k] time-steps, (where 0<δ<1), and abstract all latches in the candidate set at this point.

The philosophy behind this heuristic is to minimize the overheads of abstraction by doing it only once (Issue (1) above) and being aggressive by choosing all candidates for abstraction. δ is kept fairly low to increase the likelihood of the latches being redundant for future image computations (in agreement with Issue (2) above). δ=0.2 was used in particular experiments but other small values are equally or similarly effective.

Heuristic 2: Before the start of model checking analyze the proof P and gather a set of latches $S=\{l:l\in L, \rho(l)\leq\delta\cdot k\}$. Every r steps of image computation, compute the set of latches N not in the support set of current reached state set BDD. If $|S\cap N|\geq r$ abstract all latches in the set $S\cap N$. Repeat every r image computation steps.

The intuition behind using the set N is that the removal of such latches is less likely to cause a blow-up in the current step of image computation. This relates to Issue 3 discussed above. Parameter settings of δ=0.2, r=2, r=10 were used in particular experiments, but the heuristic is not sensitive to these particular settings.

Qualitatively, Heuristic 1 is based on an aggressive one time application of dynamic abstraction whereas Heuristic 2 is a more conservative, and controlled application of dynamic abstraction. This distinction is illustrated by the example experiments discussed below in the "Experimental Results" section.

Optimizations

Discussed below are some inexpensive optimizations that can be used to further improve the performance of a model checking algorithm that performs dynamic abstraction as described above.

(1) Bypassing the Error-State Check: A simple corollary of Theorem 1 is the following:

COROLLARY 1. The error state check $B\cap S_c\neq\emptyset$ (line 8) in Algorithm 1 will always yield "false" in the first k iterations of the algorithm.

This simple result obviates the need to perform the error state intersection check (line 8 of Algorithm 1) in the first k iterations of image computation. This check can be fairly expensive at deeper image computation steps and/or when the target states are not simply the negation of the property but an enlarged target computed through a few pre-image computation steps. For example, in case of benchmark P14 in Table 1 of FIG. 4, the error-state check at depth 11 cost more than a 1600 secs. Also, note that this result is equally applicable to frameworks that only use static abstraction.

(2) Cone of Influence Reduction: An abstraction of some latches can create opportunities for further abstraction by applying a standard cone of influence (COI) reduction on the abstracted model. Optimization may be performed after each abstraction step in the dynamic abstraction algorithms of the present invention. The key point is that any subsequent abstraction due to the COI reduction does not increase the space of allowable behaviors of the design. Thus, the quality of the abstraction is not diminished in any way but the design becomes smaller and more tractable for the model checking.

Experimental Results

The dynamic abstraction algorithm described above, as well as a static abstraction algorithm, was implemented in C++ within a suitable VIS framework. POU extraction was extended to report the redundancy index (RI) for each latch. The downstream model checker was modified to take RIs of latches as inputs and can further abstract the statically abstracted model on the fly using particular latch selection heuristics. CUDD was used for the BDD-based computation, and ZCHAFF was used as the SAT solver for BMC. The image computation used the IWLS95 method. The sift method of dynamic variable reordering was used for all BDD operations, and the image cluster size was set to 5000.

Integrated abstraction and verification tool 14 was tested for safety properties on different modules from three real-life industrial designs, which contain 10463, 40055, and 16414 lines of RTL verilog code respectively. A commercial front-end parser was used to synthesize the verilog code and to extract the cone of influence (COI) for each property. All experiments were run on 1.5 GHz Pentium 4 machines with 1G RAM, running SuSe Linux. The time-out limit was set to 24 hours for all problems. The results of these example experiments are reported in Table 1 of FIG. 4. Column 2 of Table 1 indicates whether the property (except P14) is a passing property or the length of the shortest counterexample if it is a failing property. A question mark is shown for P14, since none of the methods could finish within 24 hours. Column 6 of Table 1 indicates the number of latches in the statically abstracted model. Column 7 indicates the cumulative CPU time, which includes both abstraction time and model checking time (including BMC).

Columns 8 and 10 indicate the number of latches in the final dynamically abstracted model for Heuristics 1 and 2 respectively (see "Latch Selection Heuristic" section above) as well as the additional latches abstracted with respect to the static abstraction method. For example, the static abstraction was able to abstract a model with only 224 latches for property P8, for which the concrete model has 5468 latches. Dynamic heuristic 1 was able to further abstract 40 more latches away, and the final model had 184 latches. Similarly, dynamic heuristic 2 was able to abstract 23 more latches, and the final size of the model was 201. Again, the reported time in column 9 and 11 are cumulative CPU times. For all time-out cases, the number of completed image computation steps is indicated. For example, for P14, dynamic heuristic 1 was able to compute 26 steps of images within 24 hours (without hitting bad states or reaching fix-point), while static abstraction and heuristic 2 could only finish 13 steps. Therefore, a better partial result was achieved by the dynamic approach 1 over the static approach and heuristic 2.

As shown in Table 1, dynamic heuristic 1 is extremely powerful in reducing the overall runtime, even though the number of additional abstracted latches is not very significant in some cases. For example, with only 10 additional latches abstracted away for P12, heuristic 1 achieves over an order of magnitude speed-up compared to the pure static abstraction approach. Also for P8, heuristic 1 is able to reduce the overall time from 1198 seconds down to 305 seconds. However, as discussed in previous section, aggressive abstraction may potentially slow down the subsequent model checking. In our experiment, dynamic heuristic 1 does experience occasional slow-down. For example, heuristic 1 spent 145 seconds on P4, in which it took 174 steps of image computation to reach fix-point. On the other hand, both static abstraction and dynamic heuristic 2 needed only 51 steps of image computation to reach fixed-point in 68 seconds. As explained in the previous section, heuristic 2 is a more conservative and controlled application of dynamic abstraction. Heuristic 2 consistently outperforms the pure static abstraction for all or nearly all cases and has achieved significant speed-up on many of them. For example, it reduced the runtime for P10 from 563 seconds down to 270 seconds.

Table 2 of FIG. 5 illustrates more detailed statistics of the BDD-based model checking process for some representative benchmarks from Table 1 of FIG. 4. The columns of Table 2 represent the peak and final BDD sizes of the model checking for the each of the three methods. The results shown in Table 2 indicate that the two dynamic abstraction methods are able to significantly reduce the BDD sizes, which is consistent with the overall runtime gains reported in Table 1. For example, for P11 dynamic 1 was able to reduce the number of peak nodes by over an order of magnitude and the number of final nodes by more than 5 times.

FIG. 6 illustrates a method of verifying a digital system design in accordance with an embodiment of the invention. At step 100, integrated abstraction and verification tool 14 receives a digital system design 12 to be verified. For example, integrated abstraction and verification tool 14 may be coupled to a digital hardware design or a software application to be verified. At step 102, abstraction module 16 of tool 14 performs an abstraction of the digital system design received at step 100 to generate an abstract model, or abstraction, of the digital system design. For example, one or more state elements (such as latches or gates) may be abstracted from the digital system design. At step 104, verification module 18 of tool 14 performs one or more steps of a BDD-based model checking process using the abstraction generated at step 102. At step 106, abstraction module 16 refines (or further abstracts) the abstraction generated at step 102, such as by further abstracting one or more state elements (such as latches or gates) from the abstraction. At step 108, verification module 18 continues the model checking process, performing one or more steps of the process using the refined abstraction generated at step 106. In some embodiments, steps 106-108 may be repeated one or more times to further refine the abstraction used in the remaining steps of the model checking process. At step 110, the model checking process completes, and various results of the model checking process may be displayed or otherwise output.

CONCLUSION

Integrated abstraction and verification tool 14 is operable to performing dynamic abstraction methods within a framework for abstraction refinement based model checking. In some embodiments, the dynamic abstraction is applied during successive image computation steps of the model checking algorithm and may be applied after and in addition to the abstraction performed by traditional static abstraction methods. The dynamic abstraction is facilitated by information gathered from an analysis of the proof of unsatisfiability of SAT-based bounded model checking problems, solved on the concrete model, and passed to the model checker. It effectively allows the model checker to work with smaller abstract models. Experiments performed on several large industrial benchmarks demonstrated that the dynamic abstraction strategies of the present invention improve the performance of a model checking flow based on abstraction refinement by up to an order of magnitude over what can be achieved with state-of-the-art static abstraction refinement methods and also enables the successful application of abstraction refinement based model checking to larger designs.

Although the presented framework is a complete method for abstraction refinement based model checking, the concept of dynamic abstraction of the present invention extends beyond the specific implementation presented herein and may be applied in any other suitable framework. For example, the notion of dynamic abstraction may be applied to other abstraction refinement frameworks incorporating a variety of model checking techniques and other heuristics for static abstraction.

Although an embodiment of the invention and its advantages are described in detail, a person skilled in the art could make various alterations, additions, and omissions without departing from the spirit and scope of the present invention as defined by the appended claims.

What is claimed is:

1. A method for verifying a digital system design, comprising:
    performing a first abstraction of a digital system design to obtain an abstract model of the digital system design, wherein the abstract model of the digital system design includes a plurality of logical state elements;
    performing one or more first steps of a multiple-step model checking process using the abstract model, the multiple-step model checking process operable to verify the digital system design;
    during the multiple-step model checking process, performing a second abstraction to further abstract the abstract model by determining a redundancy index for at least a portion of the plurality of logical state elements and abstracting one or more logical state elements from the abstract model based at least on the determined redundancy indices; and
    performing one or more second steps of the multiple-step model checking process using the further abstracted abstract model.

2. The method of claim 1, further comprising:
    at multiple points during the multiple-step model checking process, performing an additional abstraction to further abstract the abstract model; and
    performing one or more additional steps of the multiple-step model checking process using each of the further abstracted abstract models.

3. Logic for verifying a digital system design, the logic encoded in one or more media for execution using one or more processors and when executed operable to:
    perform a first abstraction of a digital system design to obtain an abstract model of the digital system design, wherein the abstract model of the digital system design includes a plurality of logical state elements;
    perform one or more first steps of a multiple-step model checking process using the abstract model, the multiple-step model checking process operable to verify the digital system design;
    during the multiple-step model checking process, perform a second abstraction to further abstract the abstract model by determining a redundancy index for at least a portion of the plurality of logical state elements and abstracting one or more logical state elements from the abstract model based at least on the determined redundancy indices; and
    performing one or more second steps of the multiple-step model checking process using the further abstracted abstract model.

4. The logic of claim 3, further operable to:
    at multiple points during the multiple-step model checking process, perform an additional abstraction to further abstract the abstract model; and
    perform one or more additional steps of the multiple-step model checking process using each of the further abstracted abstract models.

5. A system for verifying a digital system design, the system comprising an integrated abstraction and verification module, the integrated abstraction and verification module operable to:
    perform a first abstraction of a digital system design to obtain an abstract model of the digital system design, wherein the abstract model of the digital system design includes a plurality of logical state elements;
    perform one or more first steps of a multiple-step model checking process using the abstract model, the multiple-step model checking process operable to verify the digital system design;
    during the multiple-step model checking process, perform a second abstraction to further abstract the abstract model by determining a redundancy index for at least a portion of the plurality of logical state elements and abstracting one or more logical state elements from the abstract model based at least on the determined redundancy indices; and
    performing one or more second steps of the multiple-step model checking process using the further abstracted abstract model.

6. The system of claim 5, wherein the integrated abstraction and verification module is operable to:
    at multiple points during the multiple-step model checking process, perform an additional abstraction to further abstract the abstract model; and
    perform one or more additional steps of the multiple-step model checking process using each of the further abstracted abstract models.

7. A system for verifying a digital system design, the system comprising:
    means for performing a first abstraction of a digital system design to obtain an abstract model of the digital system design, wherein the abstract model of the digital system design includes a plurality of logical state elements;
    means for performing one or more first steps of a multiple-step model checking process using the abstract model, the multiple-step model checking process operable to verify the digital system design;
    means for performing, during the multiple-step model checking process, a second abstraction to further abstract the abstract model by determining a redundancy index for at least a portion of the plurality of logical state elements and abstracting one or more logical state elements from the abstract model based at least on the determined redundancy indices; and
    means for performing one or more second steps of the multiple-step model checking process using the further abstracted abstract model.

8. A method for verifying a digital system design, comprising:
    performing a model checking process including a plurality of steps to verify a digital system design, the model checking process using an abstract model of the digital system design including a plurality of logical state elements;
    after a portion of the plurality of steps, further abstracting the abstract model by determining a redundancy index for at least a portion of the plurality of logical state elements and abstracting one or more logical state elements from the abstract model based at least on the determined redundancy indices; and
    continuing the model checking process using the further abstracted abstract model.

* * * * *

UNITED STATES PATENT AND TRADEMARK OFFICE
CERTIFICATE OF CORRECTION

PATENT NO.       : 7,290,230 B2
APPLICATION NO.  : 11/082592
DATED            : October 30, 2007
INVENTOR(S)      : Mukul R. Prasad It is certified that error appears in the above-identified patent and that said Letters Patent is hereby corrected as shown below:

Column 4, Line 47, after "checking" delete "algorithn1" and insert -- algorithm --.
Column 6, Line 31, after "certain" delete "modem" and insert -- modern --.
Column 6, Line 42, after "of the" delete "algorithn1" and insert -- algorithm --.

Signed and Sealed this

Second Day of June, 2009

JOHN DOLL
*Acting Director of the United States Patent and Trademark Office*